(12) United States Patent
Vaid et al.

(10) Patent No.: US 9,231,140 B2
(45) Date of Patent: Jan. 5, 2016

(54) VENTING ASSEMBLY FOR CONCENTRATING PHOTOVOLTAIC SYSTEM MODULE

(75) Inventors: Sunil Vaid, North Brunswick, NJ (US); Peter Allen Zawadzki, Clinton, NJ (US); Gary Hering, Belle Mead, NJ (US); Philip Blumenfeld, Albuquerque, NM (US)

(73) Assignee: Suncore Photovoltaics, Inc., Albuquerque, NM (US)

( * ) Notice: Subject to any disclaimer, the term of this patent is extended or adjusted under 35 U.S.C. 154(b) by 456 days.

(21) Appl. No.: 13/181,200

(22) Filed: Jul. 12, 2011

(65) Prior Publication Data

US 2013/0014805 A1    Jan. 17, 2013

(51) Int. Cl.
*H02N 6/00* (2006.01)
*H01L 31/042* (2014.01)
*H01L 31/052* (2014.01)
*H01L 31/054* (2014.01)
*H02S 40/22* (2014.01)

(52) U.S. Cl.
CPC ........ *H01L 31/0521* (2013.01); *H01L 31/0543* (2014.12); *H02S 40/22* (2014.12); *Y02E 10/52* (2013.01)

(58) Field of Classification Search
CPC . H01L 31/048; H01L 31/052; H01L 31/0521; H01L 31/0543; Y02E 10/52; H02S 40/22
USPC ........................................................ 136/246
See application file for complete search history.

(56) References Cited

U.S. PATENT DOCUMENTS

| | | | | |
|---|---|---|---|---|
| 5,462,569 | A * | 10/1995 | Benjamin | 55/385.6 |
| 6,057,505 | A * | 5/2000 | Ortabasi | 136/246 |
| 6,325,712 | B1 * | 12/2001 | Lawless et al. | 454/277 |
| 6,399,874 | B1 * | 6/2002 | Olah | 136/259 |
| 6,717,045 | B2 * | 4/2004 | Chen | 136/246 |
| 8,463,449 | B2 * | 6/2013 | Sanders | 700/286 |
| 2009/0126794 | A1 | 5/2009 | Dimroth et al. | |
| 2009/0188560 | A1 * | 7/2009 | Lee et al. | 136/259 |
| 2009/0260674 | A1 * | 10/2009 | Linke | 136/246 |
| 2011/0048535 | A1 | 3/2011 | Nagyvary et al. | |
| 2011/0263067 | A1 | 10/2011 | Vaid et al. | |
| 2012/0152309 | A1 | 6/2012 | Miller et al. | |
| 2012/0325289 | A1 * | 12/2012 | Deck | 136/246 |

OTHER PUBLICATIONS

U.S. Appl. No. 61/424,518, filed Dec. 17, 2010, Miller et al.

* cited by examiner

*Primary Examiner* — Tamir Ayad
(74) *Attorney, Agent, or Firm* — Mueting, Raasch & Gebhardt, P.A.

(57) ABSTRACT

Solar cell modules for converting solar energy into electrical energy, such as used in a concentrating photovoltaic system. The modules have a first ventilating opening in the module housing; and a ventilating subassembly mounted on the module housing and disposed over the ventilating opening in the module housing. The ventilating subassembly has a housing having a first chamber adjacent to and in communication with the first ventilating opening in the module housing; a second chamber adjacent to the first chamber, the second chamber having a second ventilating opening to the external environment; and a filter membrane separating the first chamber from the second chamber to allow air to flow between the first chamber and the second chamber through the filter membrane.

18 Claims, 9 Drawing Sheets

VENTING ASSEMBLY FOR CONCENTRATING PHOTOVOLTAIC SYSTEM MODULE

BACKGROUND

Solar array modules are constructed to house solar cell receivers that mount a solar cell that converts solar energy into electrical current. The modules include a housing, and a number of lenses mounted on the housing that direct incoming solar energy to focus on a solar cell mounted on corresponding solar cell receivers.

The modules are often placed outdoors in various environmental conditions that may include extreme heat, cold, humidity, rain, snow, and ice. The housing protects the solar cell receivers from such environmental conditions. A vent or opening may be formed in the housing to allow air circulation.

SUMMARY

The present application is directed to a solar cell module to convert light to electricity comprising: a first housing comprising a first side and an opposing spaced-apart second side; a plurality of lenses mounted on the first side of the housing for concentrating the incoming light; a plurality of solar cell receivers on the second side of the housing, each of the plurality of solar cell receivers disposed in an optical path of one of the plurality of lenses; a first ventilating opening in the first housing; a ventilating subassembly mounted on the first housing and disposed over the ventilating opening in the first housing, the subassembly including a housing having a first chamber adjacent to and in communication with the first ventilating opening in the first housing; a second chamber adjacent to the first chamber, the second chamber having a second ventilating opening to the external environment; and a filter membrane separating the first chamber from the second chamber to allow air to flow between the first chamber and the second chamber through the filter membrane.

DETAILED DESCRIPTION

Figure 1:
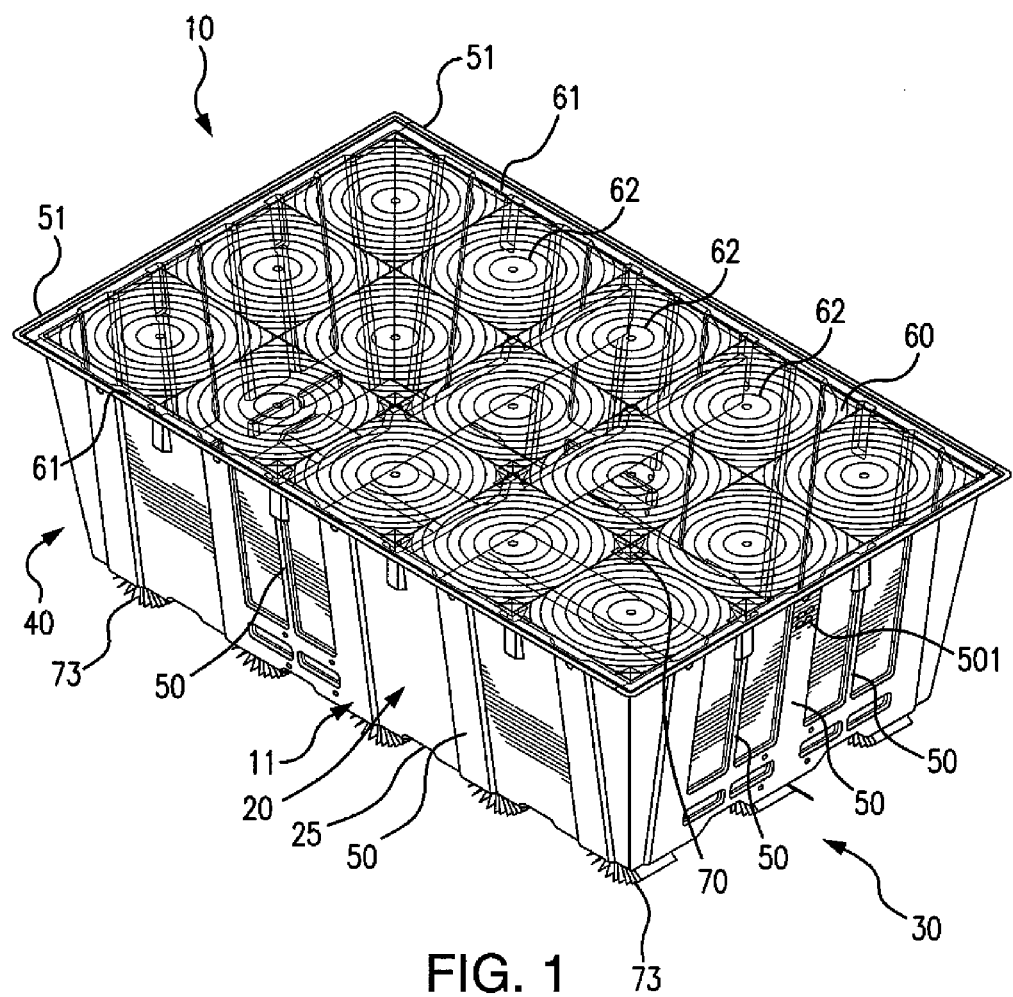
FIG. 1 is a perspective view of a solar cell module.

FIG. 1 illustrates a solar cell module 10 for converting solar energy into electrical energy. The module 10 includes a housing 11 formed from three separate members that are attached together to form an interior space. A top member 60 extends across an open side of the housing 11 and includes one or more lenses 61. One or more solar cell receivers 70 (embodiments of solar cell receivers are disclosed in US Patent Publication No. 2011/0048535, herein incorporated by reference) are positioned within the interior space of the house and are aligned with one or more the lenses 61 to receive and convert the solar energy into electrical energy.

The housing 11 forms a portion of the exterior of the module 10 and provides positioning and protection to the solar cell receivers 70. The fabrication of the housing is disclosed in U.S. patent application Ser. No. 13/156,064, filed Jun. 8, 2011, herein incorporated by reference.

In particular, in one embodiment, the housing 11 is formed from a sheet member 20 including opposing first and second edges and opposing third and fourth edges. A first fold 25 extends across a length of the sheet member 20 between the first and second edges and separates a bottom side from a first lateral side, and a second fold that extends across the length between the first and second edges and separates the bottom side from a second lateral side. The first and second folds are spaced apart and defining opposing edges of the bottom side and respectively positioning the first and second lateral sides transverse to the bottom side. A first end member 30 is attached to the first edge of the sheet member along the bottom side and the first and second lateral sides. A second end member 40 is attached to the second edge of the sheet member along the bottom side and the first and second lateral sides. Each of the end members 30, 40 have an upper edge opposite from the bottom side that align with the third and fourth edges of the sheet member and form the first side of the housing; and the second side of the housing is formed by the bottom side. A more detailed depiction of the construction may be found in U.S. patent application Ser. No. 13/156,064 noted above.

One or more of the side members of the housing 11 may include ribs 50 that are stamped into the sheet material to increase the strength and rigidity. The ribs 50 include an elongated shape. The ribs 50 may extend along the entire height or a portion of the height between the top side and the bottom of the module. Ribs 50 may also extend along the bottom of the module (not shown) in longitudinal and/or lateral orientations, and may extend across the entirety or portion of the bottom. The ribs 50 along the housing may have the same or different shapes and/or sizes. The ribs 50 may also include separate elements that are attached to the side members.

The top member 60 extends across the open side of the housing 11. In the embodiment illustrated, the outer edges 61 of the top member 60 seat within the lip 51 formed around the upper side of the housing 11. The top member 60 may be attached to the housing 11 by an adhesive and/or one or more mechanical fasteners such as but not limited to screws, bolts, and rivets.

The top member 60 includes a number of lenses 62 that focus the solar energy towards the solar cell receivers 70 within the interior space of the housing 11. In one embodiment, each of the lenses 62 directs solar energy to a specific solar cell receiver 70 positioned below the lens. In one embodiment, the top member 60 includes a total of fifteen lenses 62 that includes three rows of five lenses 62.

Each of the lenses 62 may have the same or different construction, size, or shape. One specific embodiment includes each of the lenses 62 being identical. The lenses 62 may be Fresnel lenses or may be conventional spherical lenses. An advantage of Fresnel lenses is they require less material compared to a conventional spherical lens. In one embodiment, each lens 62 has a rectangular shape. In a specific embodiment, each lens is about 9 inches by 9 inches. The lenses 62 may be constructed from different materials, including but not limited to acrylic, plastic, glass, or silicone-coated glass. Each lens 62 may further include an anti-reflective coating. The array of lenses may be formed from a single acrylic, plastic, glass, or silicone-coated glass sheet mounted on the edge 61 of the housing 11.

Solar cell receivers 70 are positioned in the interior space 12 of the housing 11 and aligned with the lenses 62. Each of the solar cell receivers 70 includes a secondary optical element, a solar cell, and a heat sink 73. The arrangement of the solar cell receivers 70 may match that of the lenses 62. In one embodiment, the solar cell receivers 70 are arranged in an array of three rows each with five solar cell receivers 70 that correspond to the paired arrangement of the lenses 62 in the top member 60.

The solar cell receivers 70 include a III-V compound semiconductor multijunction solar cell including a first surface and a second surface; a bypass diode coupled with the solar cell; a heat sink 73 positioned below the second surface of the solar cell and thermally coupled to the solar cell; and an optical element positioned above the first surface to further concentrate and guide the light onto the solar cell so that the light reaching the surface of the solar cell may be concentrated by a factor of 1000 or more. The bottom portion of the heat sinks 73, each heat sink including a number of radiating fins, are shown in FIG. 1 projecting from openings in the bottom of the housing 11.

The housing 11 has a height measured between the bottom side 23 and the top member 60 to provide for accurate placement of each of the solar cell receivers 70 relative to the paired lens 62. This distance may be based on the focal length of the lens 62 with one embodiment positioning each respective solar cell receiver 70 disposed at or about the focal point away from the respective lens 62. The focal lengths of the lenses 62 may range from between about 25.4 cm (10 inches) and 76.2 cm (30 inches), with specific embodiments including focal lengths of between about 38.1 cm (15 inches) and 50.8 cm (20 inches). One specific embodiment includes a focal length of about 40.085 cm (17.75 inches).

The housing 11 may also include one or more vent openings 101 to allow air to move into and out of the interior space 12. In one embodiment, the vent openings 101 are louvered, that is, they are punched from the outside of the housing 11, so that a small overhang originally from the planer surface of the housing now extends over the actual aperture in the interior of the housing 11.

Figure 2:
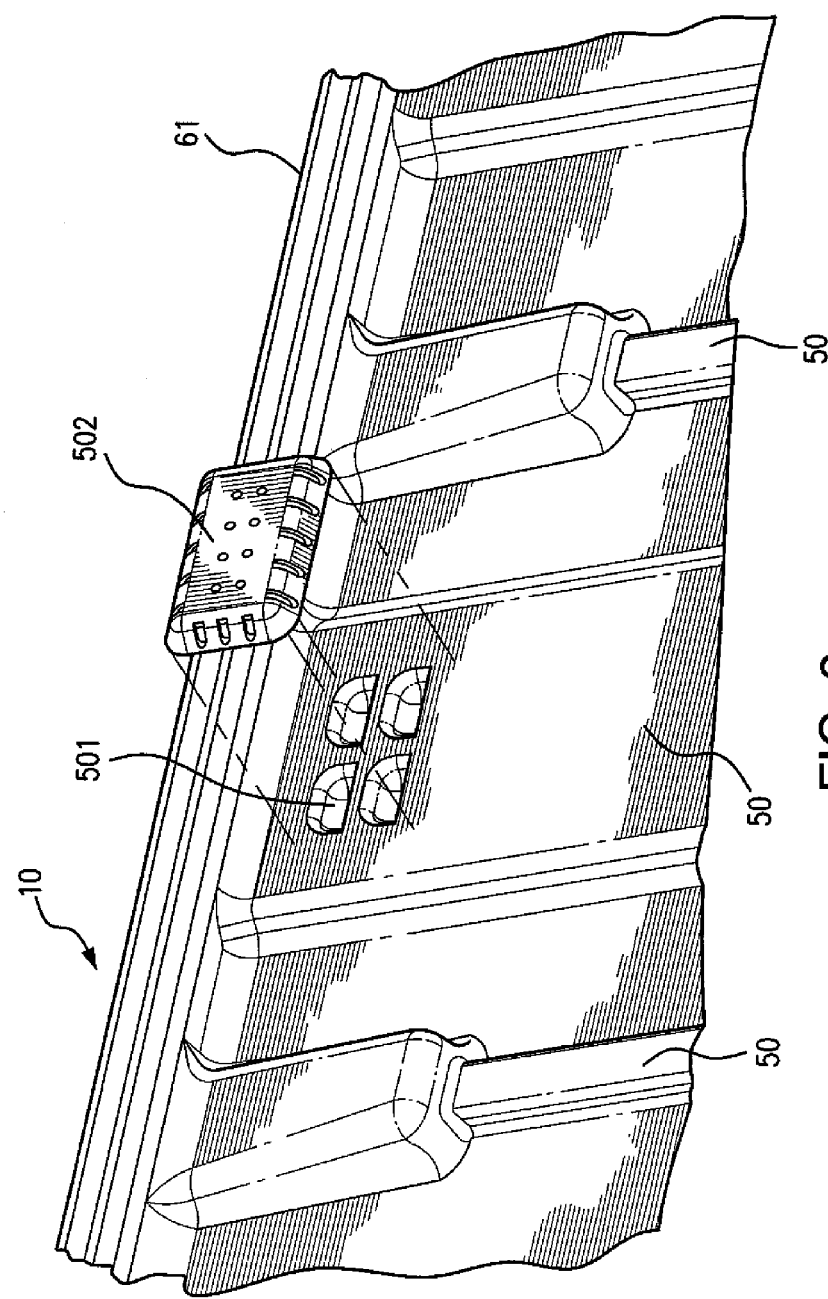
FIG. 2 is an exploded perspective view of a portion of one side of the housing of the solar cell module of FIG. 1 including a ventilating subassembly.

As noted in the exploded representation of FIG. 2, the ventilating subassembly 502 is arranged so that it extends entirely over and covers the vent openings 501 to prevent water, moisture, or other contaminants from penetrating from the external atmosphere into the interior space of the housing 11.

Figure 3:
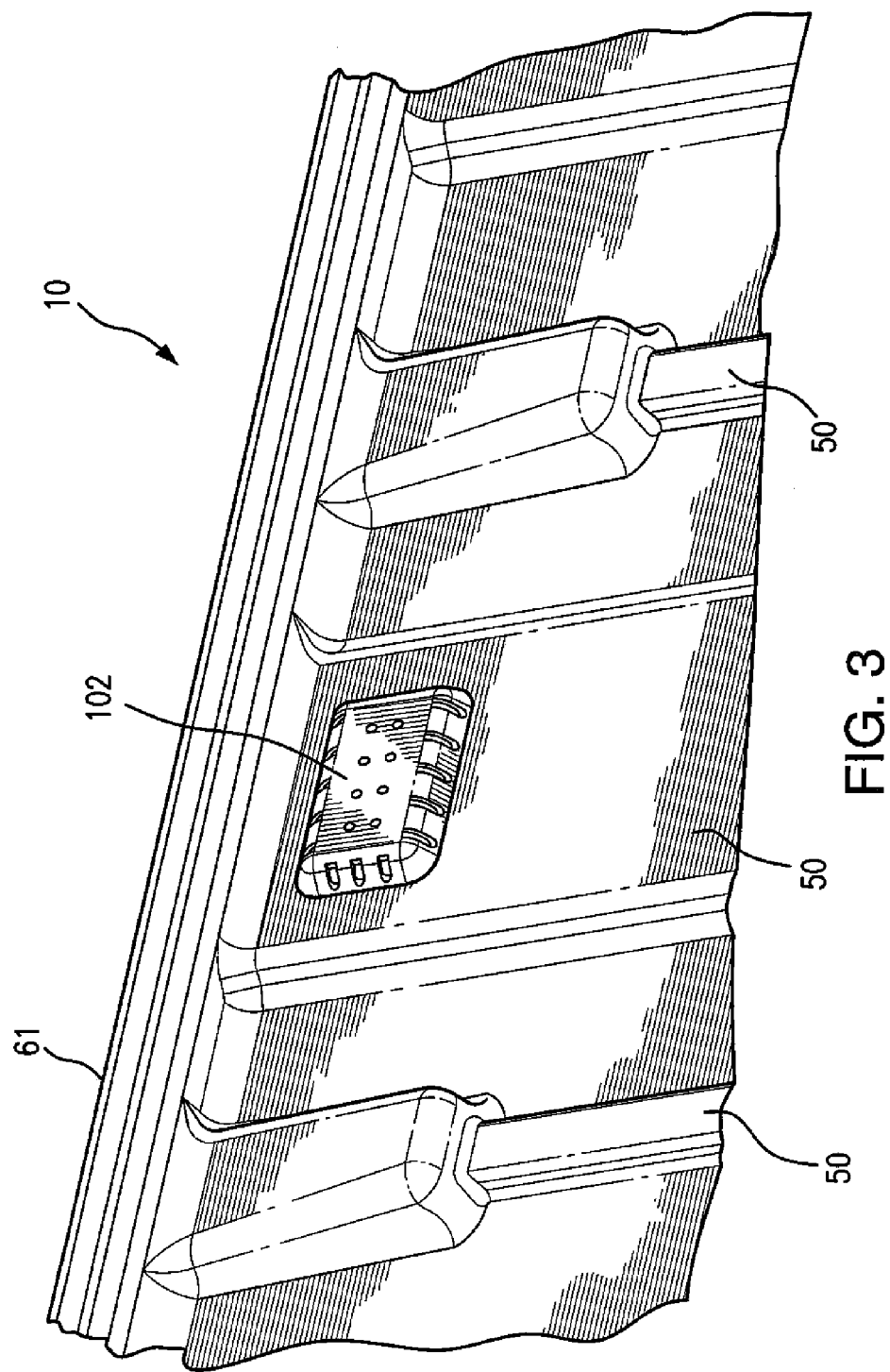
FIG. 3 is a perspective view of a portion of one side of the housing of the solar cell module of FIG. 1 including a ventilating subassembly mounted on the housing of the solar cell module.

FIG. 3 is a perspective view of a portion of one side of the housing of the solar cell module of FIG. 1 depicting the ventilating subassembly 502 mounted on the housing of the solar cell module, covering the vent openings 501. The ventilating subassembly 502 is mounted on the housing by an adhesive seal (not shown), although other types of attachment techniques may be used as well.

Figure 4:
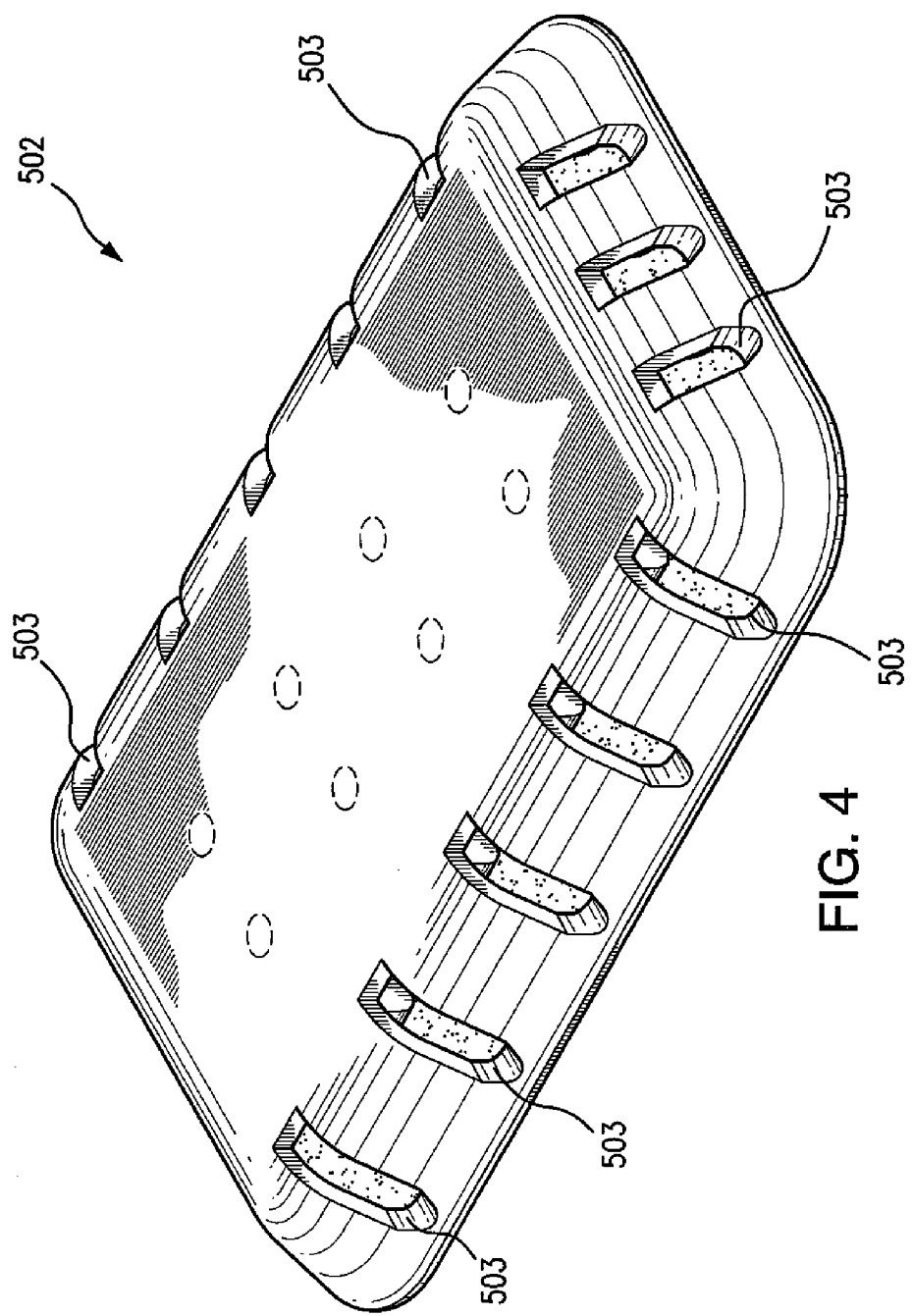
FIG. 4 is a perspective view of the top side of the ventilating subassembly.

FIG. 4 is a perspective view of the top side of the ventilating subassembly 502. The subassembly 502 includes vent openings 503 along each of the peripheral sides, which in the depicted example includes five vent openings 503 along each of the longer sides, and three vent openings 503 along each of the shorter sides.

Figure 5:
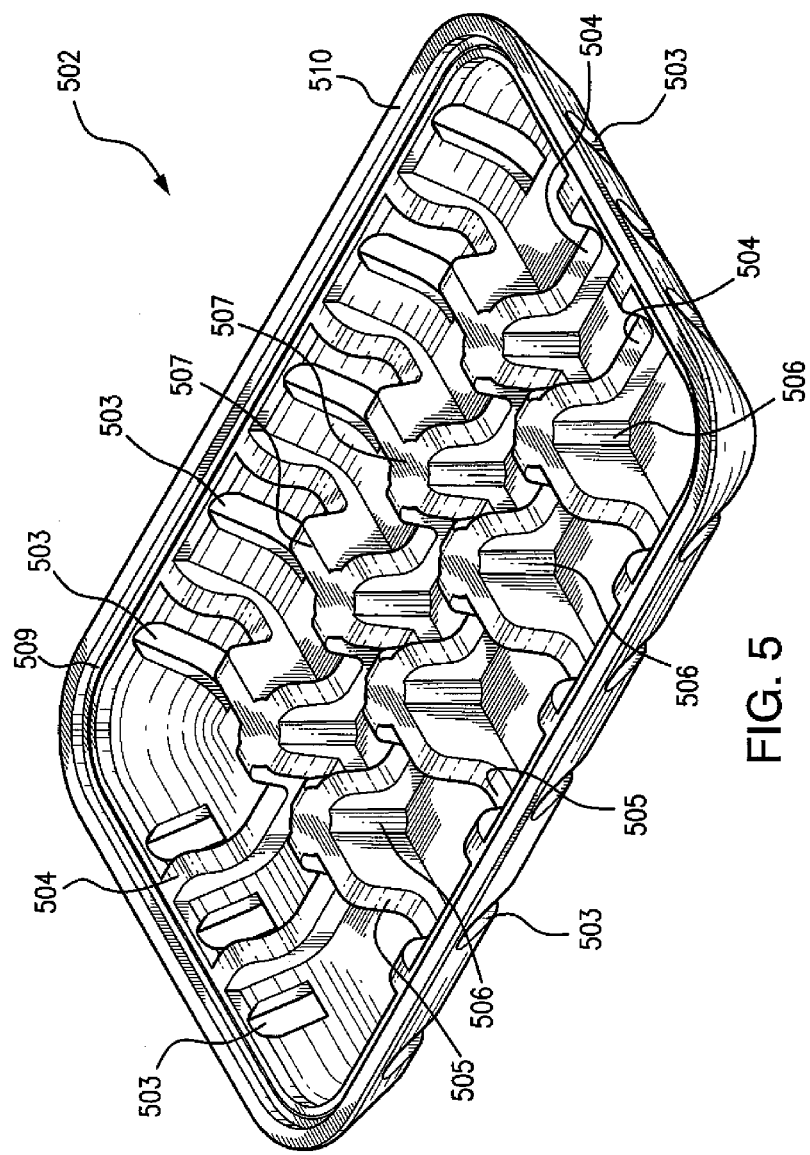
FIG. 5 is a perspective view of the bottom side of the ventilating subassembly.

FIG. 5 is a perspective view of the bottom side of the ventilating subassembly 502, showing the mechanical reinforcing and supporting features. In particular, there are two longitudinal supporting ribs or ridges 504 extending the length of the longer side of the ventilating subassembly 502, beginning and ending on the side of the housing and situated between each of the three vent openings 503 along each of the shorter sides. In the other direction, there are four transverse supporting ribs or ridges 505 beginning and ending on the side of the housing and extending the length of the shorter side of the ventilating subassembly 502, and situated between each of the five vent openings 503 along each of the longer sides. The ribs 504 and 505 intersect at various points, and at such points rise in height to a planar, generally circular plateau 507 which will form an internal supporting surface for the filter membrane. The edge of the ventilating subassembly 102 includes a planar rim 510 extending circumferentially around the periphery of the subassembly which allows the subassembly to make a flat surface to surface contact with the planar outer face of the housing 11 of the module. Slightly below the planar rim 510 is a ledge with a planar surface that also extends circumferentially around the periphery of the subassembly which allows the filter membrane 508 to be seated inside the subassembly, having a depth appropriately chosen so that the top surface of the filter membrane 508 at or slightly below the planar surface of the rim 510. In some embodiments, the filter membrane is preferably composed of Goretex™.

Figure 6:
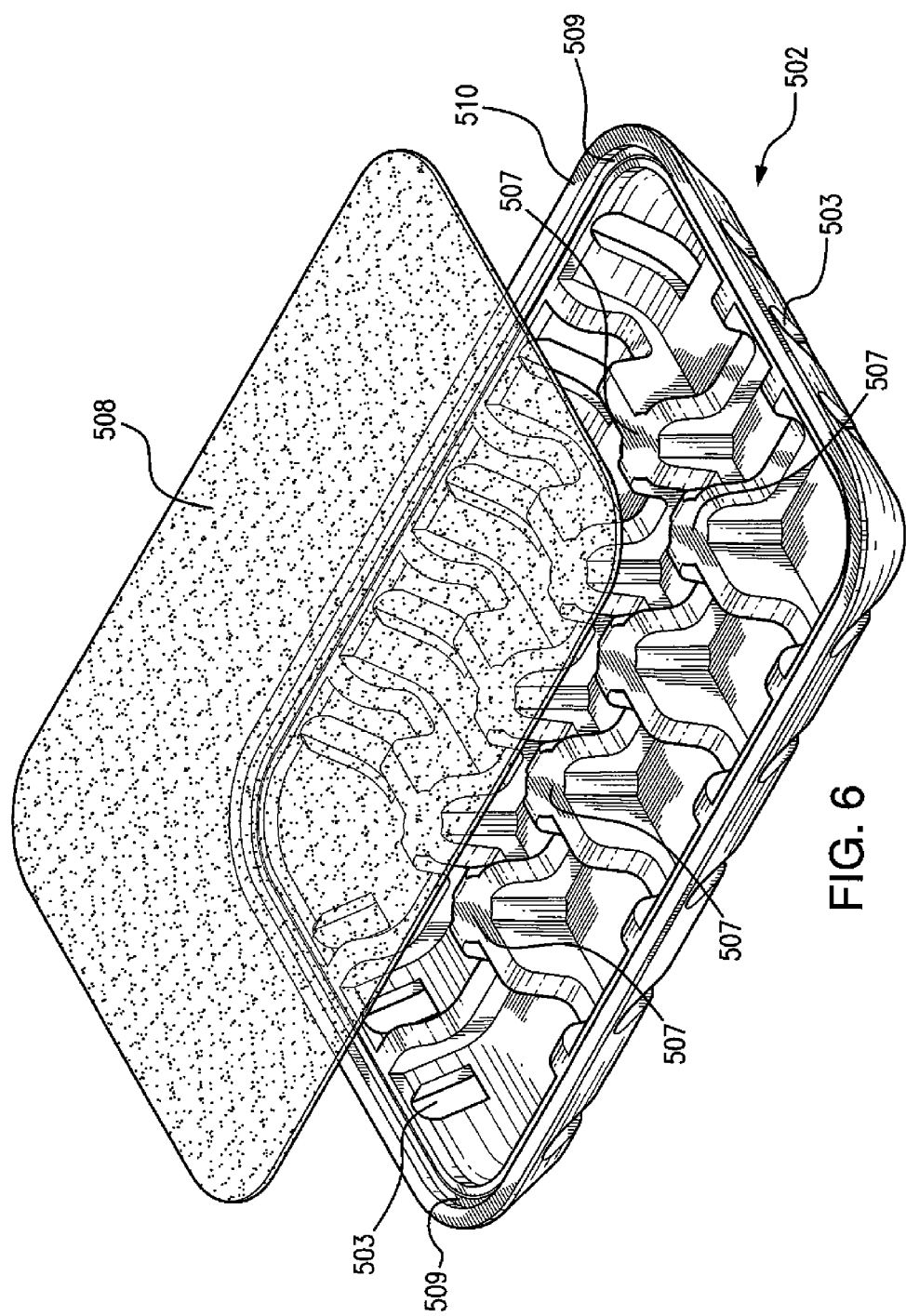
FIG. 6 is an exploded bottom perspective view of the ventilating subassembly showing the filter membrane.

FIG. 6 is an exploded bottom perspective view of the ventilating subassembly 102 showing the filter membrane 508 as it is positioned above the ventilating subassembly 502 and about to be inserted into place on the ledge 509.

Figure 7:
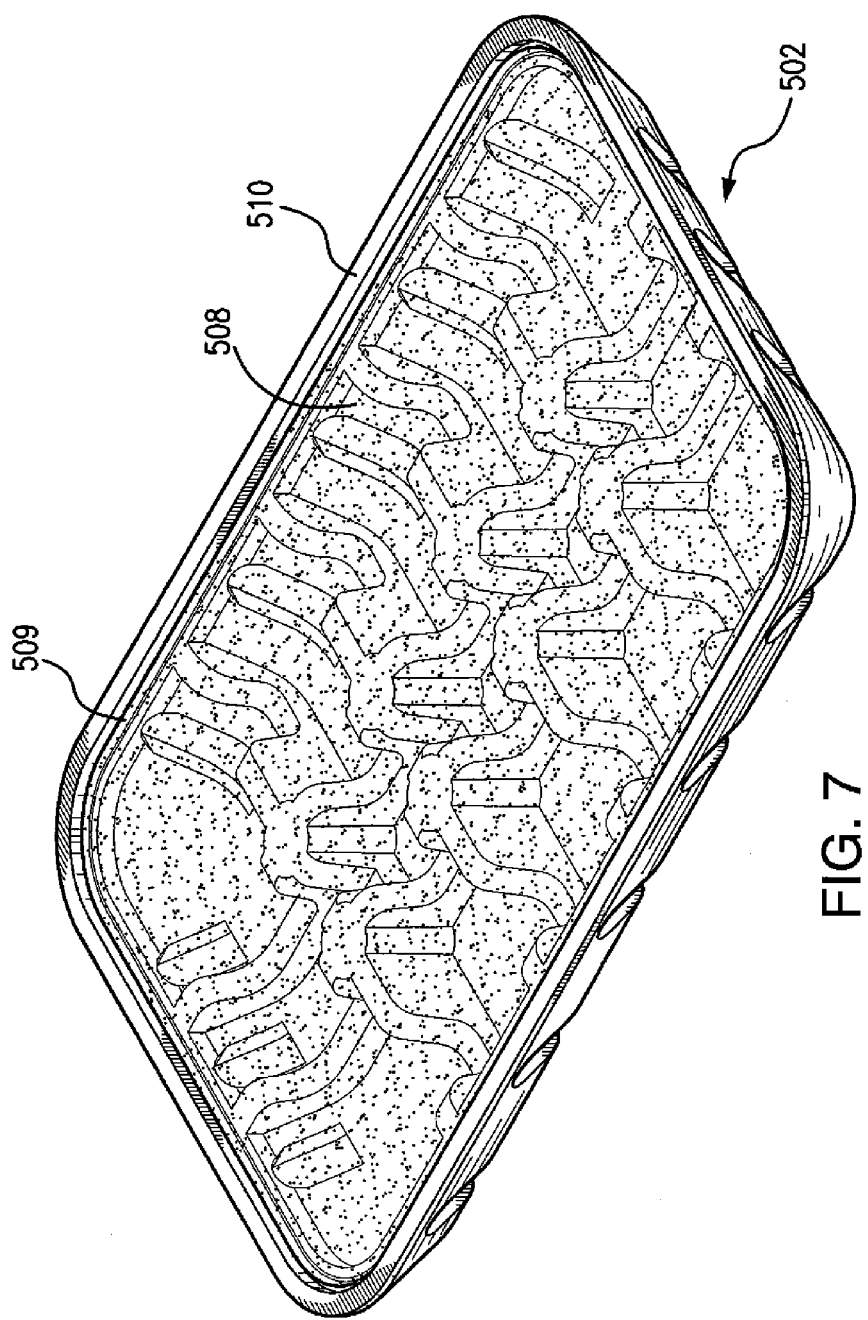
FIG. 7 is an a bottom perspective view of the ventilating subassembly showing the filter membrane positioned in the ventilating assembly.

FIG. 7 is an a bottom perspective view of the ventilating subassembly 102 showing the filter membrane 508 positioned on the ledge 509 in the ventilating assembly.

Figure 8:
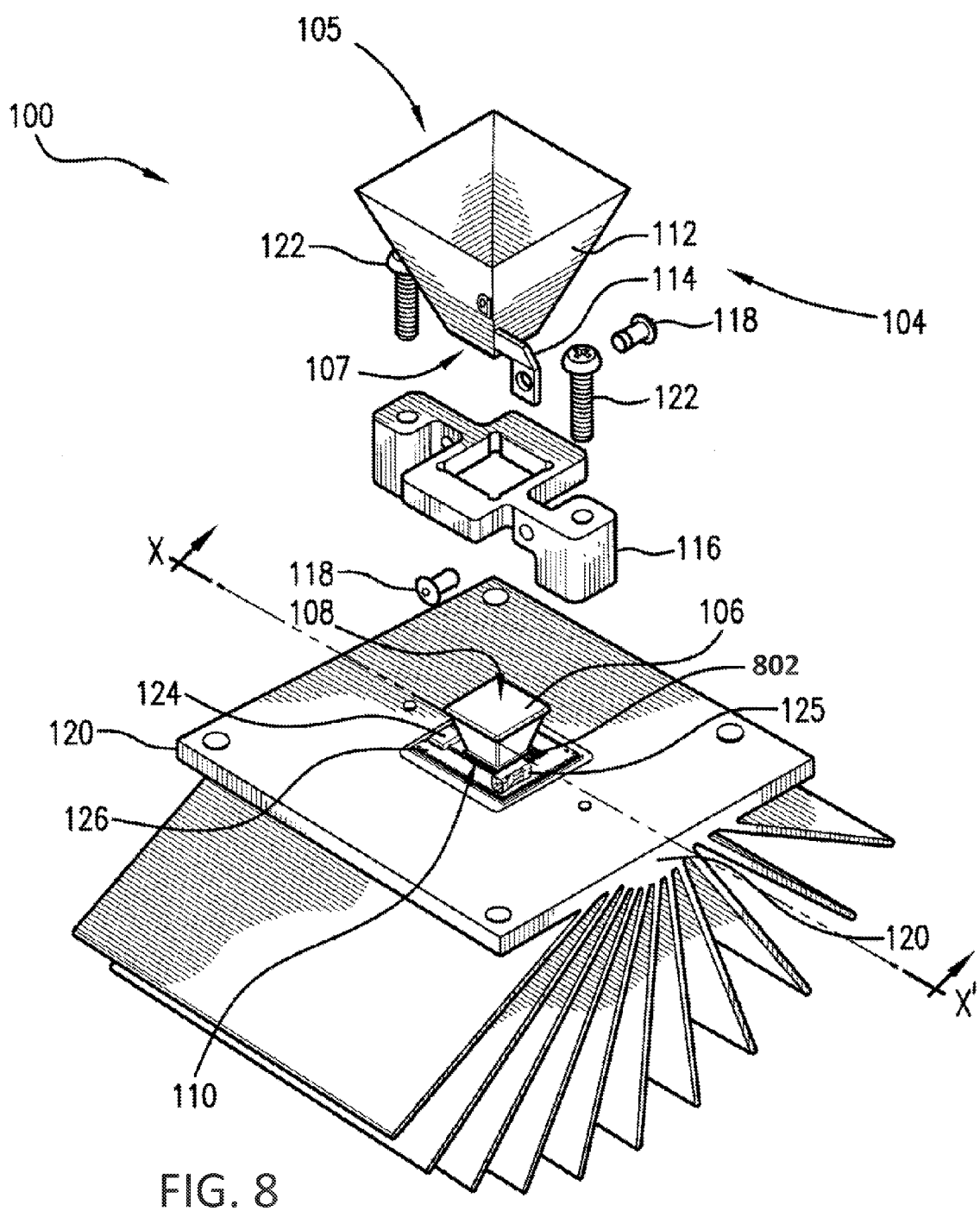
FIG. 8 is a partially exploded perspective view of an embodiment of a solar cell receiver including a solar cell, a metallized ceramic substrate and a heat sink.

FIG. 8 illustrates an embodiment of a solar cell receiver 100 including a solar cell 802. In one embodiment, the solar cell 802 is a triple-junction III-V compound semiconductor solar cell which comprises atop cell, a middle cell and a bottom cell arranged in series. In another embodiment, the solar cell 802 is a multifunction solar cell having n-on-p polarity and is composed of InGaP)/(In)GaAs III-V compounds on a Ge substrate. In each case, the solar cell 802 is positioned to receive focused solar energy from a secondary optical element 104.

The secondary optical element 104 is positioned between the solar cell 802 and a primary focusing element (not shown) such as a lens. The secondary optical element 104 is generally designed to collect solar energy concentrated by the corresponding lens toward the upper surface of the solar cell 802. The secondary optical element 104 includes an entry aperture 105 that receives light beams from the corresponding lens and an exit aperture 107 that transmits the light beams to the solar cell 802. The secondary optical element 104 includes an intermediate region 112 between the apertures 105, 107. Under ideal conditions, the lens associated with the secondary optical element 104 focuses the light directly to the solar cell 802 without the light hitting against the secondary optical element 104.

In most circumstances, the lens does not focus light directly on the solar cell 802. This may occur due to a variety of causes, including hut not limited to chromatic aberration of a refractive lens design, misalignment of the solar cell 802 relative to the lens during construction, misalignment during operation due to tracker error, structural flexing, and wind load. Thus, under most conditions, the lens focuses the light such that it reflects off the secondary optical element 104. The difference between an ideal setup and a misaligned setup may be a minor variation in the positioning of the lens of less than 1°.

The secondary optical element 104 therefore acts as a light spill catcher to cause more of the light to reach the solar cell 802 in circumstances when the corresponding lens does not focus light directly on the solar cell 802. The secondary optical element 104 can include a reflective multi-layer intermediate region. The reflective multi-layer intermediate region can be formed from different materials and have different optical characteristics so that the reflectivity of the light beams off secondary optical element 104 and transmitted to the solar cell 802 optimizes the aggregate irradiance on the surface of the solar cell 802 over the incident solar spectrum. For example, in some implementations, the inner surface of the body 112 of the secondary optical element 104 can be coated with silver or another material for high reflectivity. In some cases, the reflective coating is protected by a passivation coating such as $SiO_2$ to protect the secondary optical element 104 against oxidation, tarnish or corrosion.

The body 112 of the secondary optical element 104 has one or more mounting tabs 114 for attaching the body 112 to a bracket 116 via one or more fasteners 118. The bracket 116 is provided for mounting the secondary optical element 104 to a heat sink 120 via one or more fasteners 122. The bracket 116 is thermally conductive so that heat energy generated by the secondary optical element 104 during operation can be transferred to the heat sink 120 and dissipated. As shown in this implementation, the secondary optical element 104 has four reflective walls. In other implementations, different shapes (e.g., three-sided to form a triangular cross-section) may be employed. The secondary optical element 104 can be made of metal, plastic, or glass or other materials.

In one embodiment, a concentrator 106 is disposed between the exit aperture 107 of the secondary optical element 104 and the solar cell 802. The concentrator 106 is preferably glass and has an optical inlet 108 and an optical outlet 110. In one embodiment, the concentrator 106 is solid glass. The concentrator 106 amplifies the light exiting the secondary optical element 104 and directs the amplified light toward the solar cell 802. In some implementations, the concentrator 106 has a generally square cross section that tapers from the inlet 108 to the outlet 110. In some implementations, the optical inlet 108 of the concentrator 106 is square-shaped and is about 2 cm×2 cm and the optical outlet 110 is about 0.9 cm×0.9 cm. The dimensions of the concentrator 106 may vary with the design of the solar cell module and the receiver. For example, in some implementations the dimensions of the optical outlet 110 are approximately the same as the dimensions of the solar cell 802. In one embodiment, the concentrator 106 is a 2× concentrator. The bottom surface of the concentrator 106 can be directly attached to the upper surface of the solar cell 802 using an adhesive such as a silicone adhesive. The solar cell 802 converts the incoming sunlight directly into electricity by the photovoltaic effect.

A bypass diode 124 is connected in parallel with the solar cell 802. In some implementations, the diode 124 is a semiconductor device such as a Schottky bypass diode or an epitaxially grown p-n junction. For purposes of illustration, the bypass diode 124 is a Schottky bypass diode. External connection terminal 125 is provided for connecting the solar cell 802 and the diode 124 to other devices, e.g., adjacent solar cell receivers (not shown).

The functionality of the bypass diode 124 can be appreciated by considering multiple solar cells 802 connected in series. Each solar cell 802 can be envisioned as a battery, with the cathode of each of the diodes 124 being connected to the positive terminal of the associated "battery" and the anode of each of the diodes 124 being connected to the negative terminal of the associated "battery." When one of the serially-connected solar cell receivers 100 becomes damaged or shadowed, its voltage output is reduced or eliminated (e.g., to below a threshold voltage associated with the diode 124). Therefore, the associated diode 124 becomes forward-biased, and a bypass current flows only through that diode 124 (and not the solar cell 802). In this manner, the non-damaged or non-shadowed solar cell receivers 100 continue to generate electricity from the solar energy received by those solar cells. If not for the bypass diode 124, substantially all of the electricity produced by the other solar cell receivers would pass through the shadowed or damaged solar cell receiver, destroying it, and creating an open circuit within, e.g., the panel or array. The solar cell receiver 100 also includes a ceramic substrate 126 such as an alumina substrate for mounting of the solar cell 802 and the heat sink 120 for dissipating heat generated by the solar cell 802 during operation.

Figure 9:
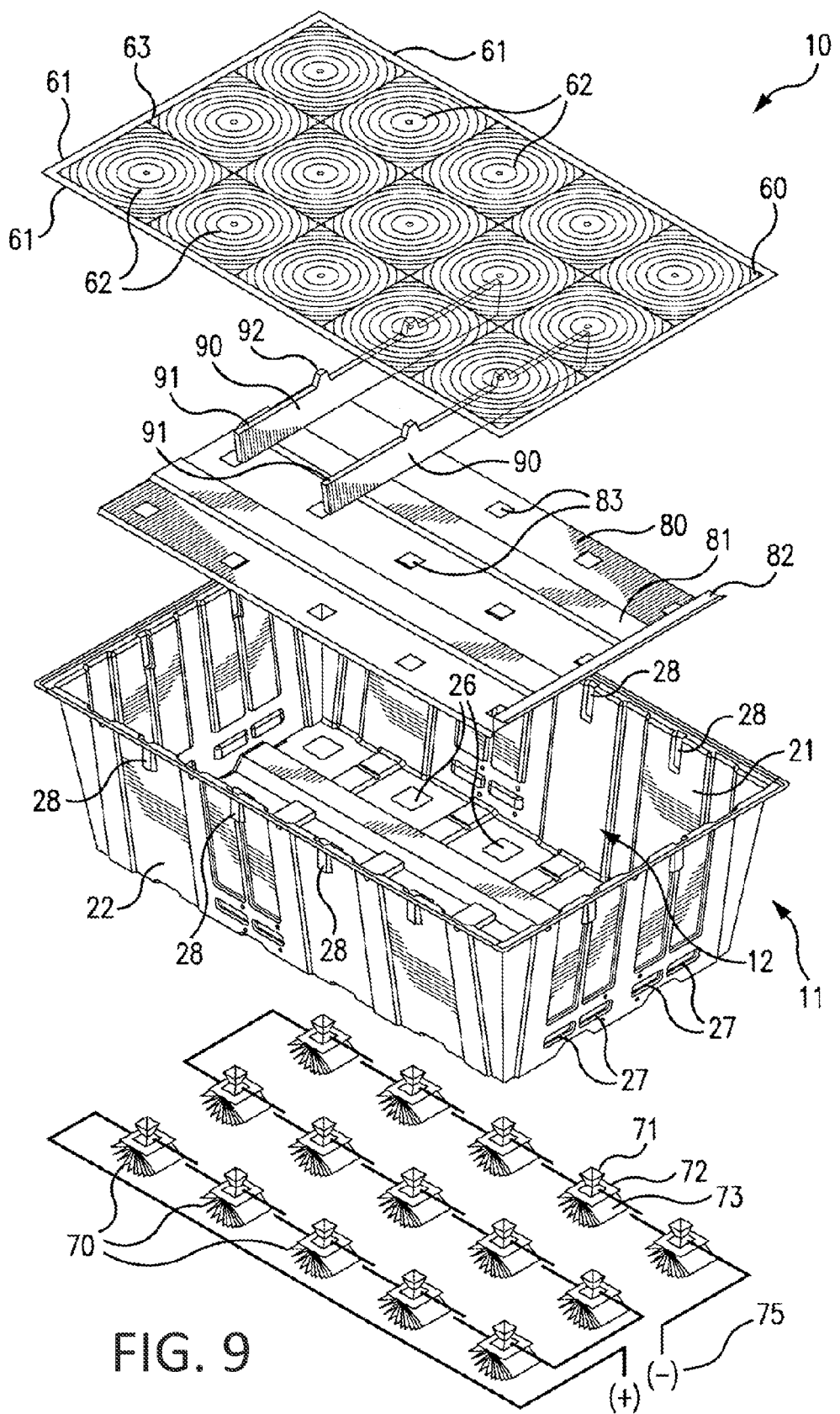
FIG. 9 is an exploded perspective view of a solar cell module.

FIG. 9 includes an exploded view of components of the solar cell module 10. The housing 11 forms the body that supports and positions the other elements. A support member 80 is positioned within the interior space 12 of the housing 11. The support member 80 includes a substantially planar shape with a length and width to fit in proximity to the bottom of the housing 11. The support member 80 may contact against or be spaced away from the bottom. The dimensions of the support member 80 may be approximately the same or may be smaller than the bottom to fit within the interior space 12. A flange 82 may extend along one or more sides to position the support member 80 within the interior space 12. The flange 82 may engage with features 27 of the housing 11 to position the support member 80. The support member 80 may include one or more ribs 81 to strengthen and increase the rigidity. The support member 80 may also include one or more openings 83 that align with the openings 26 in the bottom.

The support member 80 may further act as a shield to prevent focused solar energy from directly impinging upon the solar cell receivers 70 at areas outside of the designed areas.

One or more braces 90 may extend across the interior space 12 to further support the housing 11. The braces 90 include an elongated shape with opposing ends that fit within slots 28 in the housing 11. As illustrated in FIG. 9, the braces 90 include first ends that fit within slots 28 in the first side 21 and second ends that fit within slots 28 in the second side 22. Clips 91 may be sized to fit into the slots 28 to secure the braces 90.

The braces 90 may also be positioned to contact against and support the top member 60. One of the sides 91 of the braces 90 face upward and may contact against the inner surface of the top member 60. The sides 91 may also include protrusions 92 to further contact against the top member 60.

The top member 60 extends across the open side of the housing 11. In the embodiment illustrated, the outer edges 61 of the top member 60 seat within the lips 51 formed around the upper side of the housing 11. The top member 60 may be attached to the housing 11 by an adhesive and/or one or more mechanical fasteners such as but not limited to screws, bolts, and rivets.

The top member 60 includes a number of lenses 62 that focus the solar energy towards the solar cell receivers 70 within the interior space 12 of the housing 11. In one embodiment, each of the lenses 62 directs solar energy to a specific solar cell receiver 70 positioned below the lens. In one embodiment, the top member 60 includes a total of fifteen lenses 62 that includes three rows of five lenses 62.

Each of the lenses 62 may have the same or different construction, size, or shape. One specific embodiment includes each of the lenses 62 being identical. The lenses 62 may be Fresnel lenses or may be conventional spherical lenses. An advantage of Fresnel lenses is they require less material compared to a conventional spherical lens. In one embodiment, each lens 62 has a rectangular shape. In a specific embodiment, each lens is about 9 inches by 9 inches. The lenses 62 may be constructed from different materials, including but not limited to acrylic, plastic, and glass. Each lens 62 may further include an anti-reflective coating.

The top member 60 may be formed as a sheet 63 and sized to extend across the open side of the housing 11. The sheet 63 includes a series of openings each sized to receive one of the lenses 62. The sheet 63 may be formed from various materials, including but not limited to plastic, acrylic, and aluminum. The top member 60 also extends across the open side of the housing 11 and prevents the ingress of water, rain, or ice into the interior space 12.

Solar cell receivers 70 are positioned in the interior space 12 of the housing 11 and aligned with the lenses 62. Each of the solar cell receivers 70 includes a secondary optical element 71, a solar cell 72, and a heat sink 73. The arrangement of the solar cell receivers 70 may match that of the lenses 62. In one embodiment, the solar cell receivers 70 are arranged in an array of three rows each with five solar cell receivers 70 that correspond to the paired arrangement of the lenses 62 in the top member 60.

The heat sink 73 is operatively connected to the solar cell 72. The heat sink 73 may include abase and one or more outwardly-extending wings.

As illustrated in FIG. 9, the solar cell receivers 70 are connected in series. An end connector 75 is positioned on a side of the module 10.

The housing 11 may be configured for accurate alignment of each of the solar cell receivers 70 relative to its paired lens 62. In one embodiment, the solar cell receivers 70 are mounted through the bottom side of the housing 11 with the heat sink 73 positioned outward beyond the bottom side. The solar cell 72 and the secondary optical element 71 extend through one of the openings 26 in the bottom and one of the openings 83 in the sun shield member 80 and are positioned within the interior space 12. The sunshield member 80 is positioned on top of the receivers 70, with the secondary optical element 71 extending through the openings 83 therein. The size of the heat sink 73 and/or the solar cell receiver 70 extends across and plugs the openings 26 to prevent the ingress of water into the interior space 12. The solar cell receivers 70 may be attached to the housing 11 by adhesives and/or mechanical fasteners.

The housing 11 has a height measured between the bottom side and the top member 60 to provide for accurate placement of each of the solar cell receivers 70 relative to the paired lens 62. This distance may be based on the focal length of the lens 62 with one embodiment positioning each respective solar cell receiver 70 disposed at or about the focal point away from the respective lens 62. The focal lengths of the lenses 62 may range from between about 25.4 cm (10 inches) and 76.2 cm (30 inches), with specific embodiments including focal lengths of between about 38.1 cm (15 inches) and 50.8 cm (20 inches). One specific embodiment includes a focal length of about 40.085 cm (17.75 inches).

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the scope of this invention. Furthermore, it is to be understood that the invention is solely defined by the appended claims.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A solar cell module to convert light to electricity comprising:
   a first housing comprising a first side and an opposing spaced-apart second side;
   a plurality of lenses mounted on the first side of the first housing for concentrating incoming light;
   a plurality of solar cell receivers on the second side of the first housing, each of the plurality of solar cell receivers disposed in an optical path of one of the plurality of lenses and comprising:
     a III-V compound semiconductor multijunction solar cell including a first surface and a second surface;
     a bypass diode coupled with the solar cell;
     a heat sink positioned below the second surface of the solar cell and thermally coupled to the solar cell; and
     an optical element positioned above the first surface and defining an entry aperture configured to receive light from a corresponding lens of the plurality of lenses and an exit aperture configured to transmit the light to the solar cell, wherein the optical element is configured to further concentrate and guide the light from the corresponding lens of the plurality of lenses onto the solar cell so that the light reaching the surface of the solar cell is concentrated by a factor of 1000 or more;

a first ventilating opening in the first housing; and
a ventilating subassembly mounted on the first housing and disposed over the first ventilating opening in the first housing, the subassembly including:
a second housing defining an open side and having a first chamber adjacent to and in communication with the first ventilating opening in the first housing and a second chamber adjacent to the first chamber, the second chamber having a second ventilating opening to an external environment; a rim lying in a plane and extending entirely around a periphery of the open side of the second housing, wherein the rim contacts the first housing around the first ventilating opening, wherein the plane defines a boundary of the first chamber; and
a filter membrane spaced a distance away from the first housing to separate the first chamber from the second chamber to allow air to flow between the first chamber and the second chamber through the filter membrane such that the first chamber is located between the first housing and the filter membrane.

2. A solar cell module of claim 1, wherein the first ventilating opening is louvered.

3. A solar cell module of claim 1, wherein the second ventilating opening comprises a plurality of substantially rectangular shaped openings.

4. A solar cell module of claim 3, wherein the substantially rectangular shaped openings are disposed on each side of the ventilating subassembly and extend around a periphery of the ventilating subassembly.

5. A solar cell module of claim 1, wherein the ventilating subassembly is substantially rectangular in shape.

6. A solar cell module of claim 1, wherein the first housing comprises:
a sheet member including opposing first and second edges and opposing third and fourth edges, a first fold that extends across a length of the sheet member between the first and second edges and separates a bottom side from a first lateral side, and a second fold that extends across the length between the first and second edges and separates the bottom side from a second lateral side, the first and second folds being spaced apart and defining opposing edges of the bottom side and respectively positioning the first and second lateral sides transverse to the bottom side;
a first end member attached to the first edge of the sheet member along the bottom side and the first and second lateral sides;
a second end member attached to the second edge of the sheet member along the bottom side and the first and second lateral sides;
each of the end members having an upper edge opposite from the bottom side that align with the third and fourth edges of the sheet member and form the first side of the first housing; and
wherein the second side of the first housing is formed by the bottom side.

7. The solar cell module of claim 6, wherein each of the bottom side and the first and second lateral sides of the first housing are substantially planar.

8. The solar cell module of claim 6, wherein a first distance between the third edge and the first fold of the first housing is equal to a second distance between the fourth edge and the second fold of the first housing.

9. The solar cell module of claim 6, wherein the first and second end members of the first housing have a substantially identical shape and size.

10. The solar cell module of claim 6, the first housing further comprising ribs formed in the sheet member that extend across the first and second pair of lateral sides.

11. The solar cell module of claim 6, wherein the first housing further defines a plurality of openings that extend through the bottom side.

12. The solar cell module of claim 6, wherein the first housing further comprises an open top side formed between the first and second lateral openings and the first and second end members, the open top side being larger than the bottom side.

13. The solar cell module of claim 6, wherein the first housing includes five substantially planar sides.

14. The solar cell module of claim 6, wherein the first fold of the first housing is positioned in the same plane as the second fold of the first housing and is parallel with the second fold of the first housing.

15. A solar cell module to convert light to electricity comprising:
a module housing defining an open side and at least one module housing ventilating opening;
a lens top member coupled to the open side of the module housing for concentrating incoming light, wherein the lens top member and the module housing define an interior space;
a plurality of solar cell receivers located within the interior space, wherein each of the plurality of solar cell receivers comprises:
a III-V compound semiconductor multijunction solar cell, and
an optical element defining an entry aperture configured to receive light from a corresponding lens of the lens top member and an exit aperture configured to transmit the light to the solar cell, wherein the optical element is configured to concentrate and guide incoming light from the corresponding lens of the lens top member onto the solar cell so that the light reaching the surface of the solar cell is concentrated by a factor of 1000 or more;
a ventilating subassembly defining an open side and comprising a rim lying in a plane and extending entirely around a periphery of the open side of the ventilating subassembly, wherein the open side of the ventilating subassembly is coupled to the module housing over the at least one module housing ventilating opening to define a chamber, wherein the rim contacts the module housing around the at least one module housing ventilating opening, wherein the plane defines a boundary of the chamber, wherein the ventilating subassembly defines at least one subassembly opening extending between the chamber and an exterior of the ventilating subassembly; and
a filter membrane located within the ventilating subassembly between the at least one subassembly opening and the at least one module housing ventilating opening and spaced a distance away from the module housing such that at least a portion of the chamber is located between the module housing and the filter membrane and at least a portion of the chamber is located between the filter membrane and the at least one subassembly opening.

16. The module of claim 15, wherein the ventilating subassembly is located outside of the interior space.

17. The solar cell module of claim 1, wherein the plurality of lenses are part of a single sheet coupled to the first side of the first housing.

18. The solar cell module of claim 15, wherein the ventilating subassembly comprises a ledge portion within the chamber configured to position the filter membrane the distance away from the module housing.

* * * * *